United States Patent
Sampica et al.

(10) Patent No.: US 7,566,254 B2
(45) Date of Patent: Jul. 28, 2009

(54) PROCESS FOR GLASS-TO-GLASS SEALING OLEDS WITH DRY FILM ADHESIVE

(75) Inventors: James D. Sampica, Springville, IA (US); Paul R. Nemeth, Cedar Rapids, IA (US); Vincent P. Marzen, Robins, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 601 days.

(21) Appl. No.: 11/214,518

(22) Filed: Aug. 30, 2005

(65) Prior Publication Data

US 2009/0117809 A1    May 7, 2009

(51) Int. Cl.
*H01J 9/00* (2006.01)

(52) U.S. Cl. ............... 445/25; 445/24; 156/358; 156/382

(58) Field of Classification Search .............. 445/24, 445/25; 156/104–106, 244.27, 295, 288, 156/382, 358
See application file for complete search history.

(56) References Cited

U.S. PATENT DOCUMENTS

| | | | | |
|---|---|---|---|---|
| 5,329,391 | A | * 7/1994 | Miyamoto et al. | 349/187 |
| 5,365,356 | A | * 11/1994 | McFadden | 349/187 |
| 5,592,288 | A | 1/1997 | Sampica et al. | 356/62 |
| 7,381,110 | B1 | * 6/2008 | Sampica et al. | 445/24 |
| 7,435,311 | B1 | 10/2008 | Marzen et al. | 156/286 |
| 7,452,258 | B1 | 11/2008 | Marzen et al. | 445/25 |

* cited by examiner

*Primary Examiner*—Mariceli Santiago
(74) *Attorney, Agent, or Firm*—Daniel M. Barbieri (57) ABSTRACT

A method of sealing an Organic Light-Emitting Diode (OLED) assembly is disclosed. A dry film adhesive is applied to a capping layer. An OLED assembly is placed in a cavity of a fixture. The capping layer is positioned in the cavity of the fixture such that a first edge of the capping layer contacts the OLED assembly and a second edge of the capping layer is separate from the OLED assembly. Atmospheric pressure is reduced between the capping layer and the OLED assembly. The second edge of the capping layer is dropped such that the second edge of the capping layer is adjacent the OLED assembly.

19 Claims, 6 Drawing Sheets

PROCESS FOR GLASS-TO-GLASS SEALING OLEDS WITH DRY FILM ADHESIVE

RELATED INVENTIONS

This application is related to the following co-pending U.S. patent applications, all of which are filed on an even date herewith and are incorporated by reference herein in their entirety:

U.S. patent application Ser. No. 11/214,547, "OLED Face Seal Incorporating Liquid Adhesive And Cover Glass," Vincent Marzen et al.;

U.S. patent application Ser. No. 11/215,050, "Process For Applying A Protective Cover On An Organic Light-Emitting Diode Using A Liquid Adhesive," James Sampica Et Al.; And U.S. patent application Ser. No. 11/215,683, "Panel-To-Panel Lamination Method For Improved Uniformity," Vincent Marzen et al.

FIELD OF THE INVENTION

The invention relates to displays, and more particularly, to the manufacture of organic light-emitting diode (OLED) displays.

BACKGROUND OF THE INVENTION

Organic light-emitting diodes (OLED) displays are light-emitting diodes that incorporate semiconducting organic polymers. OLEDs are beginning to be developed in large quantities and used in many different applications as OLED technology matures. However, because the organic materials used in OLED technology are sensitive to oxygen and humidity, these materials must be sealed to prevent penetration by air or water. One solution has been to adhere a capping or protective layer such as a semi-rigid substrate such as glass or plastic upon the OLED materials, and then sealing the edge of the combined OLED/glass assembly with a moisture-proof edge seal. Another solution has been to attach the semi-rigid substrate to the OLED materials using an application of adhesive applied to the outer perimeter of a face of the substrate. However, known processes do not provide an effective seal between the capping layer and the OLED materials. Known bonding processes often result in bubbles and defects in the adhesive interface or in the OLED layer itself. What is needed is a reliable method of adhering a protective layer to an OLED assembly.

It is therefore an object of the invention to provide such a reliable method of adhering a protective layer to an OLED assembly.

A feature of the invention is dropping a protective layer onto an OLED assembly in a controlled manner.

An advantage of the invention is the elimination of bubbles in the adhesive layer between the OLED and the protective layer.

SUMMARY OF THE INVENTION

The invention provides a method of sealing an Organic Light-Emitting Diode (OLED) assembly. According to the method, a dry film adhesive is applied to a capping layer. An OLED assembly is placed in a cavity of a fixture. The capping layer is positioned in the cavity of the fixture such that a first edge of the capping layer contacts the OLED assembly and a second edge of the capping layer is separate from the OLED assembly. Atmospheric pressure is reduced between the capping layer and the OLED assembly. The second edge of the capping layer is dropped such that the second edge of the capping layer is adjacent the OLED assembly.

The invention also provides a method of adhering a substantially transparent protective cover to an organic light-emitting diode (OLED) assembly. The OLED assembly includes a substrate. According to the method, a dry film adhesive is applied to substantially all of a face of the protective cover. The protective cover is positioned such that a first edge of the face of the protective cover contacts the OLED assembly and a second edge of the protective cover is separate from the OLED assembly. The atmospheric pressure between the protective cover and the OLED assembly is reduced. The second edge of the protective cover is dropped such that the second edge of the protective cover is adjacent the OLED assembly. The protective cover and the OLED assembly are pressed together for a predetermined time.

The invention further provides an organic light-emitting diode (OLED) assembly. The OLED assembly comprises an OLED layer, which includes a substrate. A substantially transparent cover plate is configured to contact the OLED layer to thereby protect the OLED layer. A dry film adhesive is applied to substantially all of a face of the cover plate. The cover plate is placed upon the OLED layer by dropping a first edge of the cover plate to contact the OLED layer while a second edge is contacting the OLED layer, the dry film adhesive thereby adhering the cover plate to the OLED layer.

DETAILED DESCRIPTION OF THE DRAWINGS

Describing now the invention with reference to FIGS. 1-7, the invention provides a reliable method of applying a protective cover 12 to an OLED assembly 14. It should be noted that the drawings are not necessarily drawn to scale, and that the dimensions of the various disclosed components have been drawn for the purposes of clarity in understanding the invention. Protective cover 12, which may also be called a capping layer, is made of substantially transparent glass or plastic. A transparent dry film adhesive 16 is applied to a substantial portion of a face 17 of protective cover 12. Preferably dry film adhesive 16 covers all or virtually all of face 17. Dry film adhesive 16 may be securely adhered to face 17 using a roller (not shown) or other suitable technique. An exemplary type of dry film adhesive is #9483 manufactured by 3M Corp. of Minneapolis, Minn., although other dry film adhesives may alternatively be used.

Figure 1:
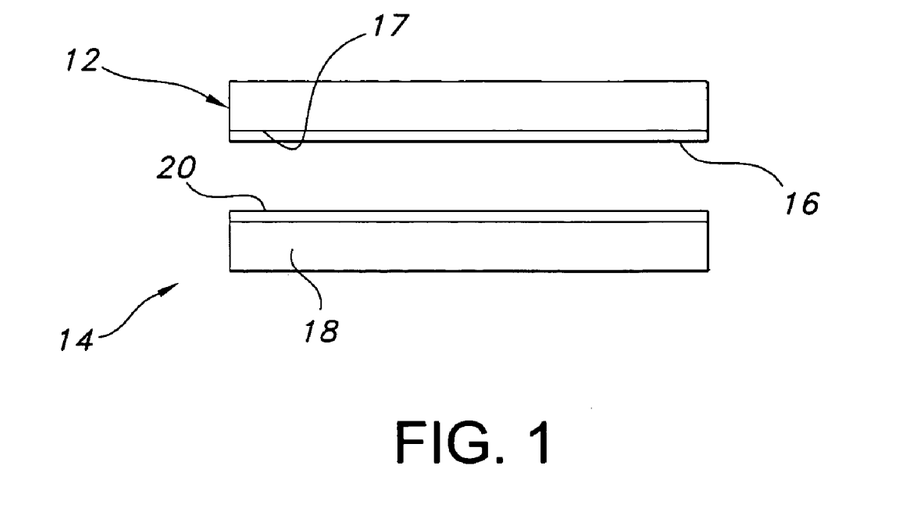
FIG. 1 is a side elevational view of portions of an OLED display manufactured according to the invention.

OLED assembly 14 includes a back pane or substrate 18, which may be plastic, glass, stainless steel, or other suitable material. OLED materials 20 are disposed upon substrate 18 using any suitable manufacturing method.

Figure 2:
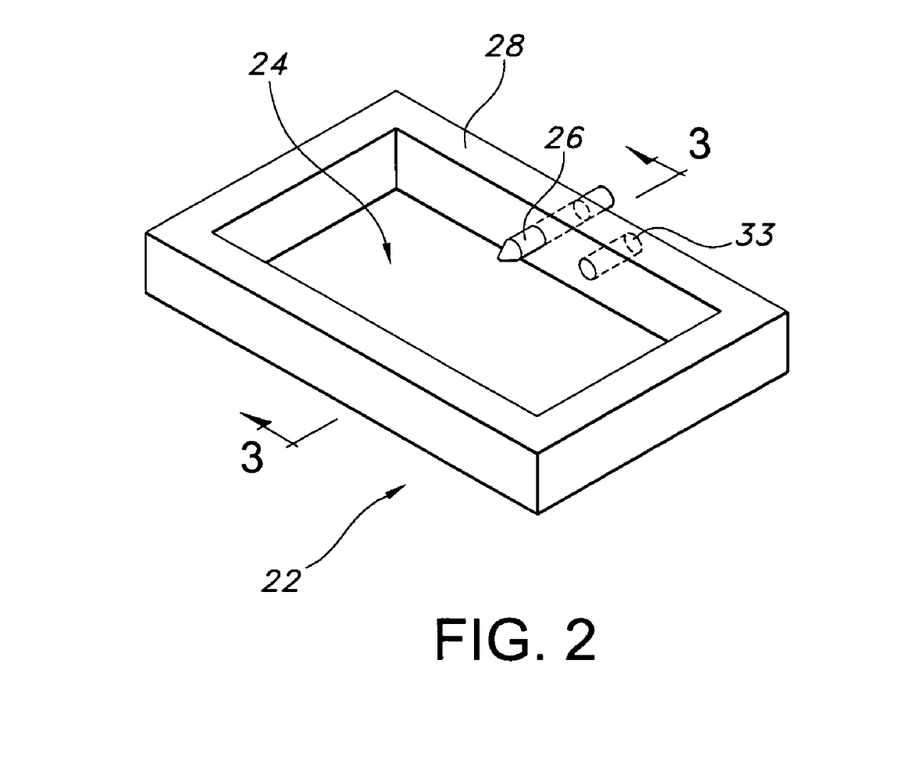
FIG. 2 is a perspective view of a fixture used with the invention.

A manufacturing fixture 22 used with the invented process is shown in FIG. 2. Fixture 22 includes a recessed portion or cavity 24 having dimensions at least as great as OLED assembly 14. Along one side of cavity 24 is a retractable pin 26, which is depicted in greater detail in FIGS. 3 and 4. In a preferred embodiment, retractable pin 26 has a cylindrical cross-section that passes through a sealed wall 28 of fixture 22. Pin 26 has an actuating end 30 that may be attached to a mechanical actuating mechanism such as a servo (not shown) or the like. Alternatively, actuating end 30 may be manually moved by an operator. Pin 26 also has a spherical contact head 32 that supports an edge of protective cover 12 during a portion of the invented process, as will be further described. A passage 33 is disposed along a wall of cavity 24 (such as wall 28). Passage 33 is connected to a vacuum pump or other apparatus (not shown) capable of reducing the air pressure within cavity 24 to below atmospheric pressure.

Figure 3:
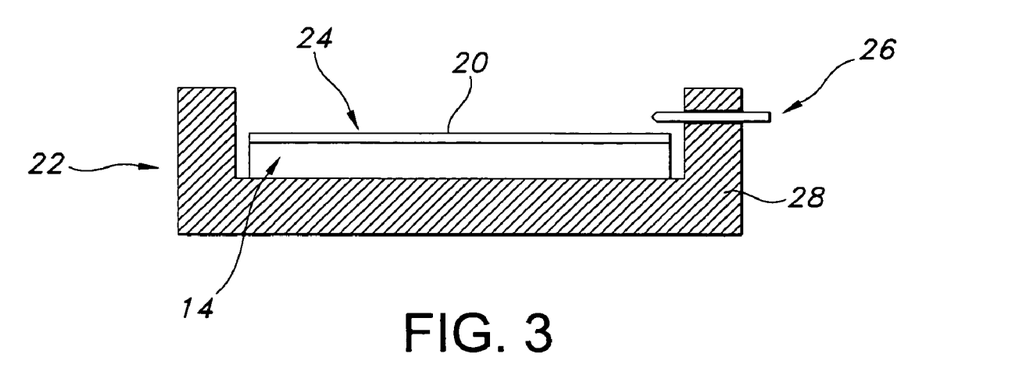
FIG. 3 is a sectional view taken along line 3-3 in FIG. 1 during a manufacturing step according to the invention.
Figure 4:
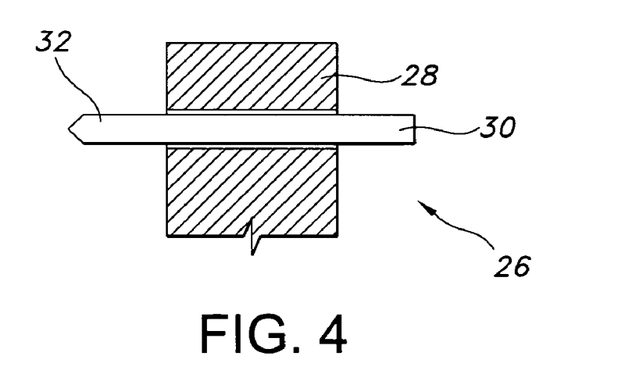
FIG. 4 is a detail view of FIG. 2.
Figure 5:
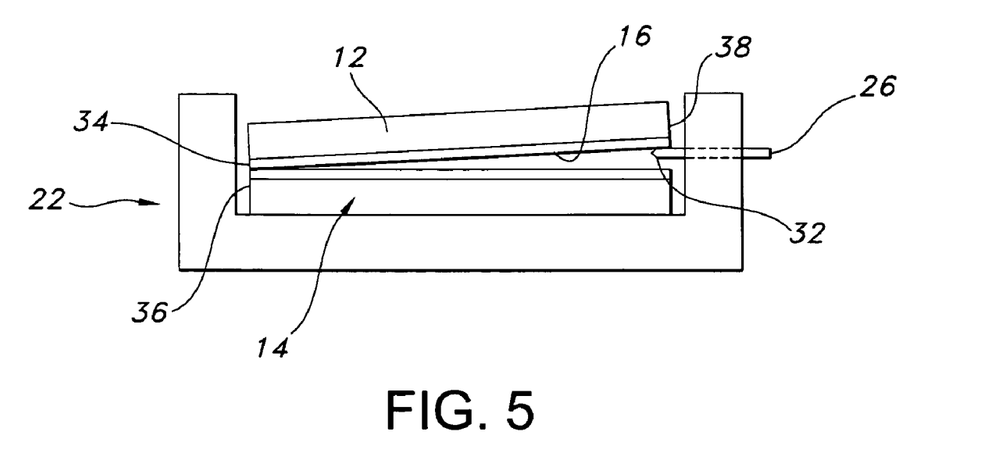
FIG. 5 is a sectional view of the fixture during another manufacturing step according to the invention.
Figure 6:
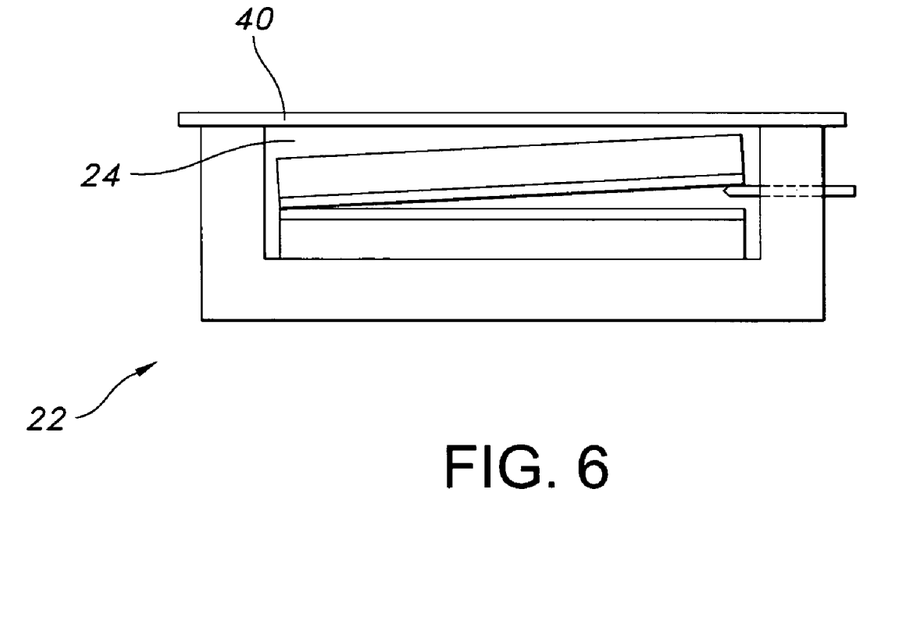
FIG. 6 is a sectional view of the fixture during still another manufacturing step according to the invention.

To attach protective cover 12 to OLED assembly 14 according to the invention, OLED assembly 14 is placed in cavity 24 of fixture 22 so that OLED materials 20 are facing the open end of the cavity (FIG. 3). Protective cover 12 is placed in the cavity with dry film adhesive 16 facing OLED materials 20. As shown in FIG. 5, a first edge 34 of protective cover 12 contacts a first edge 36 of OLED assembly 14, and a second edge 38 of protective cover 12 rests upon contact head 32 of retractable pin 26.

Figure 7:
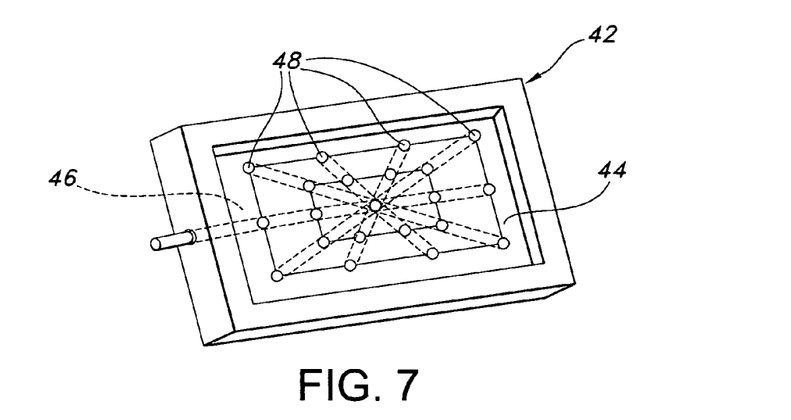
FIG. 7 is a perspective view of a plenum according to an embodiment of the invention.
Figure 8:
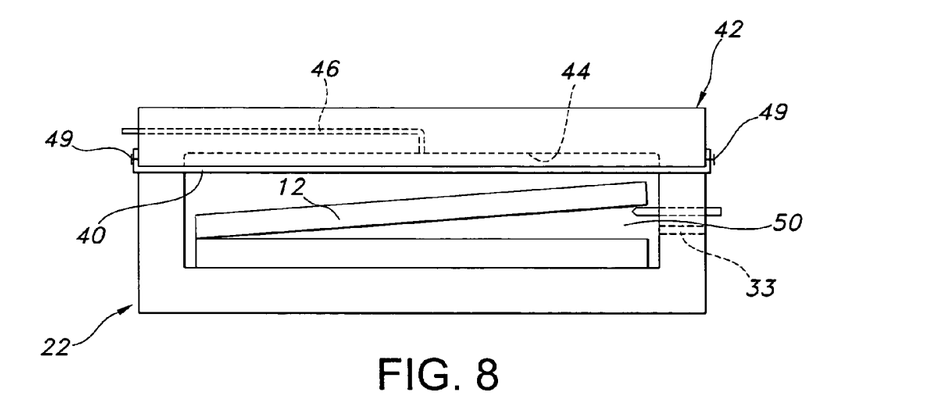
FIG. 8 is a sectional view of the fixture and plenum during yet another manufacturing step according to the invention.

An air-impermeable flexible element, such as an elastomeric bladder 40, is placed upon fixture 22 so that cavity 24 is completely enclosed (FIG. 6) and isolated from the atmosphere. Bladder 40 has a variable volume and can be selectively expanded or contracted as desired to achieve a desirable pressure on the OLED assembly and the protective cover. Preferably, bladder 40 is mounted on or otherwise held fast by a pressing structure or plenum 42 (FIG. 7). Plenum 42 is designed to hold bladder 40 taut while enclosing cavity 24. Plenum 42 has a recessed portion 44 over which the bladder is stretched. An internal air passage 46 communicates with a plurality of outlets 48 distributed throughout recessed portion 44. A perforated screen, preferably made of metal, can be bonded to recessed portion 44 to optimize uniformity of vacuum and pressure. A vacuum pump (not shown) is operationally connected to the internal air passage 46 and the outlets 48. Selective operation of the vacuum pump causes pressure to be placed upon or removed from bladder 40 when the bladder covers recessed portion 44. FIG. 8 shows bladder 40 being positioned between fixture 22 and plenum 42. Bladder 40 may be attached to plenum 42 using a plurality of hooks 49 or other means of attachment, or as previously mentioned may simply be held taut between the plenum and the fixture by applying pressure or force to the plenum and/or the fixture.

Figure 9:
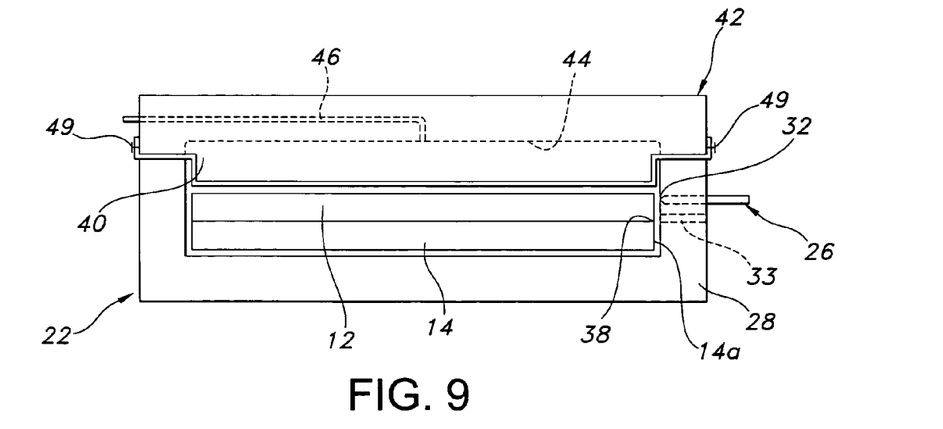
FIG. 9 is a sectional view of the fixture and plenum during another manufacturing step according to the invention.
Figure 10:
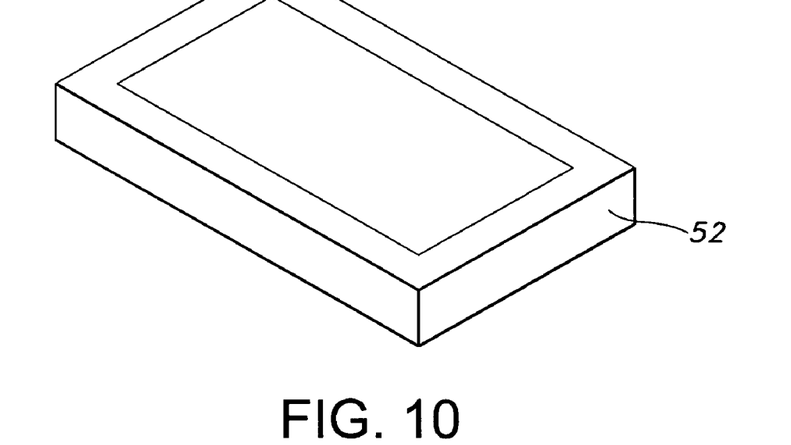
FIG. 10 is a perspective view of an OLED display according to the invention.

To ensure an effective contact between OLED assembly 14 and protective cover 12, the air pressure above bladder 40 is reduced. In the embodiment depicted in FIG. 8 this means that the vacuum pump (not shown) associated with plenum 42 reduces the pressure within recessed portion 44 of the plenum. Next, the air pressure in the region 50 between the protective cover and the OLED assembly is evacuated or reduced through passage 33 such that the air pressure in region 50 is substantially less than ambient air pressure. Retractable pin 26 is then retracted into wall 28 so that contact head 32 is substantially within wall 28. Second edge 38 of protective cover 12 drops to contact a second edge 14a of OLED assembly 14, as shown in FIG. 9. Bladder 40 is expanded, for example by supplying a positive pressure through internal air passage 46 to recessed portion 44 of plenum, the bladder thereby applying a predetermined amount of pressure to the protective cover and the OLED assembly for a predetermined period of time, such as 30 to 60 minutes. If necessary to improve optical clarity and reduce defects of dry film adhesive 16, the temperature surrounding fixture 22 and bladder 40 may be increased. Finally, the plenum and bladder are removed from the fixture and the combined OLED assembly and cover plate are removed from cavity 24. If the OLED assembly is to be used in extreme or severe environments, the edges of the combined OLED assembly and cover plate could be further sealed from moisture if needed by applying an edge seal tape 52 thereto as shown in FIG. 10.

Figure 11:
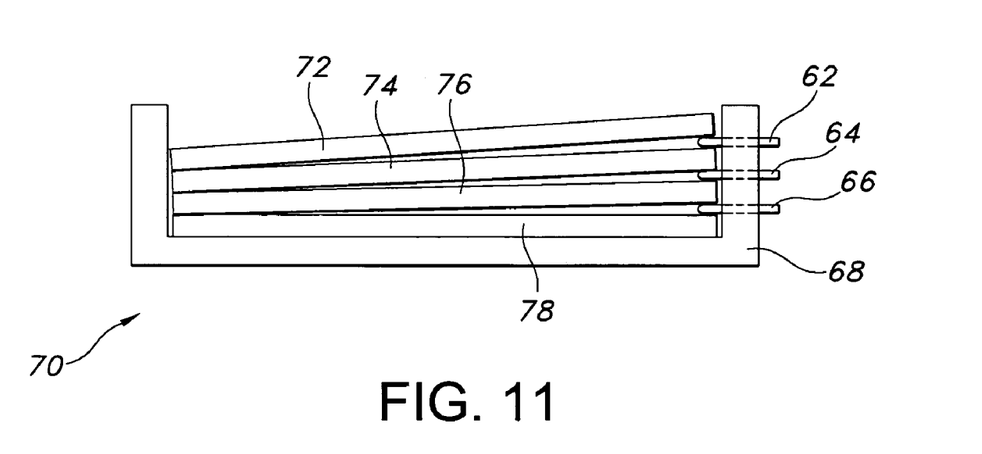
FIG. 11 is a sectional view of a fixture according to another embodiment of the invention.

The invention has been described thus far as using a single pin to hold one edge of a protective cover prior to a controlled drop onto an OLED assembly. FIG. 11 depicts another embodiment of the invention in which a plurality of pins 62, 64, 66 are mounted within a wall 68 of a fixture 70. Fixture 70 may be used to simultaneously affix multiple layers 72, 74, 76 to a substrate 78 (such as an OLED assembly) by having an edge of each layer leaning against one of pins 62, 64, 66. Sequentially retracting pins 66, 64, 62 would cause the multiple layers 76, 74, 72 to drop, in turn, onto the substrate.

Figure 12:
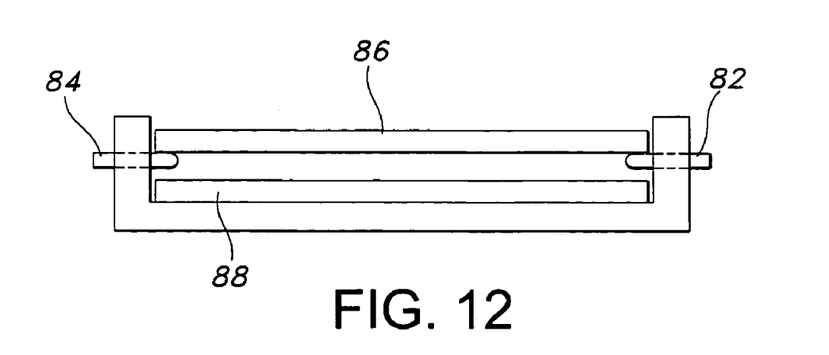
FIG. 12 is a sectional view of a fixture according to still another embodiment of the invention.

FIG. 12 depicts another variation of the invention in which a plurality of pins 82, 84 are positioned to hold a protective cover 86 completely separate from an OLED assembly 88. Sequentially or simultaneously retracting pins 82, 84 causes protective cover 86 to be dropped onto the OLED assembly as desired.

Figure 13:
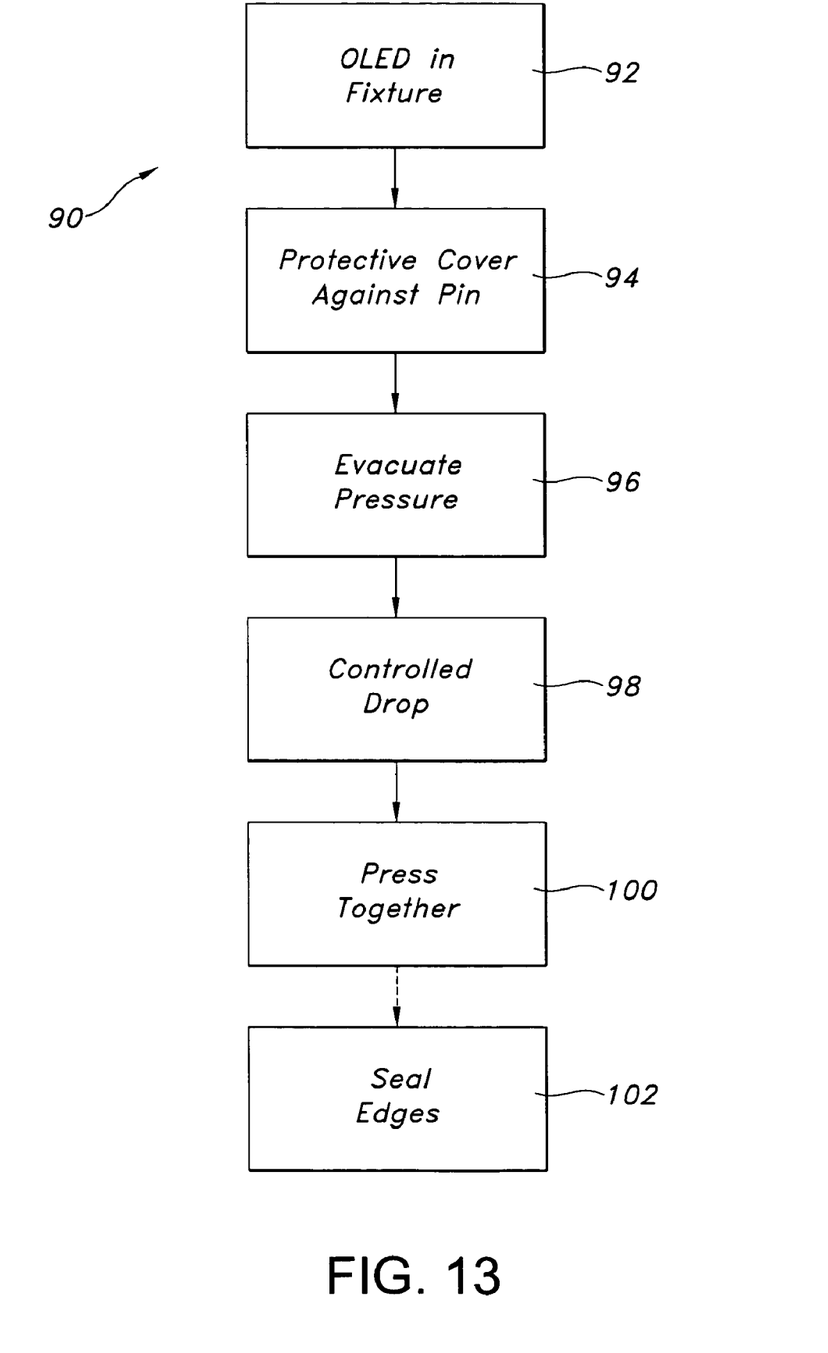
FIG. 13 is a flowchart of a method according to the invention.

FIG. 13 is a flowchart showing steps of a method 90 according to an embodiment of the invented method. In step 92 an OLED assembly is placed in a cavity of a fixture, such as fixture 22. In step 94 an edge of a protective cover is placed upon an end of a retractable element such as pin 26. In step 96 the pressure between the protective cover and the OLED assembly is evacuated or reduced. In step 98 the pin is retracted so that the protective cover drops onto the OLED assembly. In step 100 the OLED assembly and the protective cover are pressed together at a predetermined pressure, time, and temperature. In step 102 the edges of the combined OLED assembly and protective cover are sealed using, for example, a humidity-proof edge seal tape, if needed for use in severe environments.

The invention may be further varied in many ways while maintaining the spirit of the invention. For example, substrate 18 may be made of a flexible material. If so, extra measures may be required to immobilize OLED assembly 14 during the manufacturing process. Also, protective cover 12 may be made of any transparent and stiff or semi-rigid material such as plastic. Furthermore, if dry film adhesive 16 is a dual-stage type adhesive and could contain a photo-initiator or a thermal initiator, the dry-film adhesive may be further cured by exposing the combined assembly to ultraviolet light or heat once the combined assembly has been removed from cavity 24 of fixture 22. Also, bladder 40 may be actuated by or be part of a completely enclosed, balloon-like structure that imposes pressure on the protective cover 12. Finally, pin 26 may be retracted at variable rates as desired, and may be retracted horizontally or vertically with respect to the OLED assembly.

An advantage of the invention is that the controlled drop of the protective cover in a vacuum environment substantially reduces air bubbles and non-conformities between the protective cover and the OLED assembly.

Another advantage is that the use of the expandable bladder permits the evacuation of air between the protective cover and the OLED assembly prior to the controlled drop, and also provides pressure isolation to hold together the protective cover and the OLED assembly while the dry film adhesive is bonding the two parts together under a vacuum.

While the invention has been disclosed in its preferred form, the specific embodiments thereof as disclosed and illustrated herein are not to be considered in a limiting sense as numerous variations are possible. The subject matter of the invention includes all novel and non-obvious combinations and subcombinations of the various elements, features, functions and/or properties disclosed herein. No single feature, function, element or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the invention of the present disclosure.

What is claimed is:

1. A method of sealing an Organic Light-Emitting Diode (OLED) assembly, comprising:
    applying a dry film adhesive to a capping layer;
    placing an OLED assembly in a cavity of a fixture;
    positioning the capping layer in the cavity of the fixture such that a first edge of the capping layer contacts the OLED assembly, a second edge of the capping layer is separate from the OLED assembly, and the dry film adhesive is facing toward the OLED assembly;
    reducing an atmospheric pressure between the capping layer and the OLED assembly; and
    dropping the second edge of the capping layer such that the second edge of the capping layer is adjacent the OLED assembly.

2. The method of claim 1, further comprising:
    after dropping the second edge of the capping layer, pressing the capping layer and the OLED assembly together for a predetermined time.

3. The method of claim 2, wherein the pressing is accomplished by:
    positioning an expandable, flexible element in an opening of the cavity; and
    applying pressure to the flexible element such that the flexible element applies pressure against said at least one of the capping layer and the OLED assembly.

4. The method of claim 3, wherein the flexible element is attached to a pressing structure that holds the flexible element in place while applying pressure against at least one of the capping layer and the OLED assembly.

5. The method of claim 3, wherein the flexible element isolates the cavity from atmospheric pressure.

6. The method of claim 1, wherein positioning the capping layer comprises resting the second edge of the capping layer upon a movable element of the fixture, at least part of the movable element being interposed between the capping layer and the OLED assembly.

7. The method of claim 6, wherein dropping the second edge of the capping layer is accomplished by actuating the movable element such that the movable element is not interposed between the capping layer and the OLED assembly.

8. The method of claim 1, wherein reducing the atmospheric pressure between the capping layer and the OLED assembly comprises:
    isolating a region between the capping layer and the OLED assembly; and
    evacuating air pressure in the region until the atmospheric pressure within the region is substantially reduced from ambient atmospheric pressure.

9. The method of claim 8, wherein the isolating of the region is accomplished by applying a flexible element upon the fixture when the OLED assembly has been placed in the cavity of the fixture and the capping layer has been positioned in the cavity of the fixture.

10. The method of claim 1, wherein the dry film adhesive is applied to substantially all of a face of the capping layer, and further wherein said face contacts the OLED assembly when the capping layer is dropped onto the OLED assembly.

11. A method of adhering a substantially transparent protective cover to an organic light-emitting diode (OLED) assembly, the OLED assembly including a substrate, the method comprising:
    applying a dry film adhesive to substantially all of a face of the protective cover;
    positioning the protective cover such that a first edge of said face of the protective cover is separate from the OLED assembly, and the dry film adhesive is facing toward the OLED assembly;
    reducing an atmospheric pressure between the protective cover and the OLED assembly;
    dropping the protective cover such that the face of the protective cover is adjacent the OLED assembly; and
    pressing the protective cover and the OLED assembly together for a predetermined time.

12. The method of claim 11, further comprising:
    placing the OLED assembly in a recessed portion of a fixture, the fixture having a movable element upon which the first edge of the protective cover is disposed.

13. The method of claim 12, wherein the first edge of the protective cover is dropped by moving the movable element such that the first edge of the protective cover is not disposed upon the movable element.

14. The method of claim 11, wherein positioning the protective cover further comprises positioning the protective cover such that the first edge and a second edge of the protective cover are separate from the OLEO assembly.

15. The method of claim 11, further comprising:
    placing the OLED assembly in a recessed portion of a fixture, the fixture having a first movable element upon which the first edge of the protective cover is disposed, the fixture further having a second movable element upon which a second edge of the protective cover is disposed;
    wherein dropping the protective cover further comprises moving the first and second movable elements such that the first edge of the protective cover is not disposed upon the first movable element, and the second edge is not disposed upon the second movable element.

16. The method of claim 15, wherein the first and second movable elements are substantially simultaneously moved such that the first edge of the protective cover contacts the OLED assembly at substantially the same time the second edge of the protective cover contacts the OLED assembly.

17. The method of claim 11, wherein the pressing is accomplished by:
    positioning a flexible element to atmospherically isolate the protective cover and the OLED assembly within the cavity; and
    applying pressure to the flexible element such that the flexible element applies pressure against said at least one of the protective cover and the OLED assembly.

18. The method of claim 11, wherein reducing the atmospheric pressure between the protective cover and the OLED assembly comprises:
    isolating a region between the protective cover and the OLED assembly; and
    evacuating air pressure in the region until the atmospheric pressure within the region is substantially reduced from ambient atmospheric pressure.

19. The method of claim 18, wherein the isolating of the region is accomplished by a flexible element upon one of the protective cover and the OLED assembly.

* * * * *